United States Patent [19]
Schoenthaler et al.

[11] Patent Number: 4,515,297
[45] Date of Patent: May 7, 1985

[54] METHODS FOR MULTIPOINT DISPENSING OF VISCOUS MATERIAL

[75] Inventors: David Schoenthaler, Lower Makefield Township, Bucks County, Pa.; Thaddeus Wojcik, Hopewell Township, Mercer County, N.J.

[73] Assignee: AT&T Technologies, Inc., New York, N.Y.

[21] Appl. No.: 498,350

[22] Filed: May 26, 1983

[51] Int. Cl.³ ............................................. B67D 5/64
[52] U.S. Cl. .................. 222/160; 228/180.2; 427/96
[58] Field of Search ............... 222/160, 319, 394, 399; 228/180 A, 180 R, 178, 179, 6 R; 427/256, 287, 286, 96; 118/315

[56] References Cited

U.S. PATENT DOCUMENTS

| 2,794,417 | 6/1957 | Starkey et al. | 118/315 |
| 3,077,857 | 2/1963 | Widner | 118/315 |
| 3,570,721 | 3/1971 | Cushman | 222/319 |
| 3,970,222 | 7/1976 | Duffield | 222/148 |
| 4,030,640 | 6/1977 | Citrin et al. | 222/207 |
| 4,154,379 | 5/1979 | Schermutzki | 222/420 |
| 4,156,398 | 5/1979 | McDaniel | 427/286 |
| 4,156,495 | 5/1979 | Weinhold | 222/1 |
| 4,295,596 | 10/1981 | Doten et al. | 228/180 A |

OTHER PUBLICATIONS

"Soldering Circuit Assemblies in the 1980's" by D. Schoenthaler; Western Electric Co., Inc. U.S.A., 1980.

Primary Examiner—Joseph J. Rolla
Assistant Examiner—Kenneth Noland
Attorney, Agent, or Firm—M. de Picciotto; D. J. Kirk

[57] ABSTRACT

A multipoint dispensing of viscous material onto a board (23) comprises the monitoring and controlling of several process parameters such as the initial gap ($\delta$) between a dispensing tool (20,25) and the board (23), the dispense pressure time cycle within the tool (FIG. 3A) and the tool velocity cycle (FIG. 3B). Also, an improved method for loading solder paste into the dispensing tool includes applying vacuum to two regions of the tool while vibrating it in its axial direction (FIG. 4). Furthermore, improved techniques for preventing crust formation on the paste within the tool, and for controlling the viscosity of the solder paste within the tool, achieve consistent dispensing results in a production environment.

17 Claims, 8 Drawing Figures

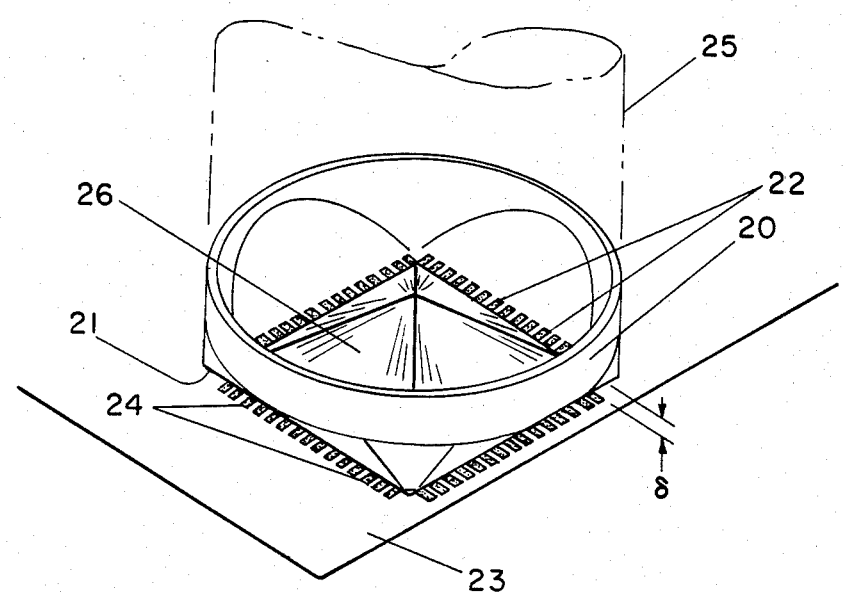
Figure 2
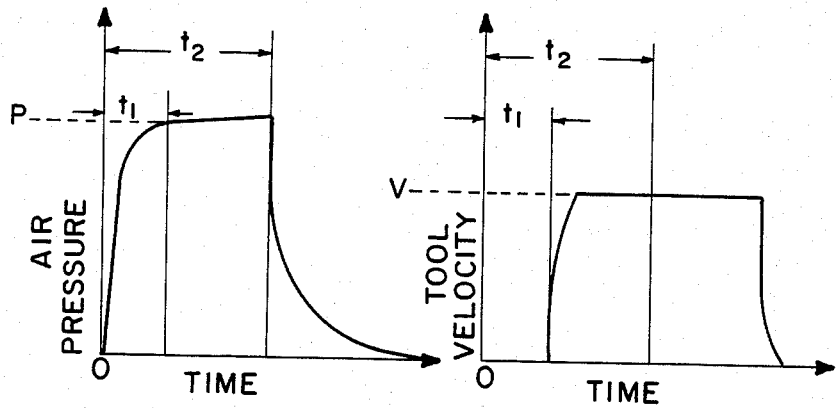
Figure 3A
Figure 3B

METHODS FOR MULTIPOINT DISPENSING OF VISCOUS MATERIAL

TECHNICAL FIELD

The present invention is directed to a technique for multipoint dispensing of viscous materials and more particularly, to a method for multipoint dispensing of solder paste for surface mounting of chip carriers on circuit boards.

BACKGROUND OF THE INVENTION

Over the past few years, the complexity and capabilities of integrated circuits (IC's) have grown while their dimensions continued to shrink. The rapid advances in semiconductor technology nearly doubles the number of circuit functions per semiconductor chip per year. In order to keep pace with the very large scale integration technology, the semiconductor chips require higher pin out packages having small sizes thereby achieving optimal electronic performance and increased circuit board densities. Because of the foregoing, the well known dual in-line packages (DIP's) are gradually being replaced by surface-mounted chip carrier packages.

Coincident with the higher packing density of surface-mounted components is the corresponding reduction in solder joint size and spacing on the printed wiring board (PWB), as well as the increase in number of solder joints on each PWB assembly. Several methods of solder deposition are described in a paper by D. Schoenthaler entitled "Soldering Circuit Assemblies in the 1980's" published in Proceedings of Printed Circuit World Convention II, Munich, West Germany, Vol. 1, pages 131–140, June 9–12, 1981. When using screen or stencil printing of solder on a PWB, the volume of solder deposited on the PWB must be sufficient to prevent joint opens due to poor component lead planarity, PWB warpage, inaccurate component placement and misregistration of the solder mask with respect to the bond sites of the PWB. On the other hand, in view of the reduced spacing between neighboring solder joints on the PWB, the quantity of solder deposited should not be excessive to avoid an electrical short between two adjacent solder joints.

As mentioned in the above reference by D. Schoenthaler, an alternative method for depositing solder paste on PWB's is a technique using a multipoint dispensing tool comprising a hollow chamber having a multiorifice nozzle attached at one end thereof. The nozzle orifices are spaced to match the PWB footprint pattern and the corresponding chip carrier lead geometry. Applicants observed that the implementation of multipoint dispensing techniques in a manufacturing environment encountered various problems affecting the reliability and reproducibility of the solder joints. Some of these problems include the poor control of the volume and geometry of the dispensed solder paste, clogging of the orifices of the nozzle, variations in the paste viscosity, and difficulty in achieving uniform paste distribution among the orifices due to paste crust and/or void formations within the dispensing tool.

Therefore, there exists a need for an improved solder paste multipoint dispensing technique capable of being reliably and reproducibly implemented in a semiconductor manufacturing environment.

SUMMARY OF THE INVENTION

In one embodiment of the invention, a method for multipoint dispensing of viscous material onto a board comprises positioning a viscous material dispenser having a plurality of orifices at a predetermined distance from the board; during a first time interval, increasing the pressure within the dispenser to a predetermined value thereby forcing viscous material out of the dispenser orifices onto the board; moving the dispenser, at the end of the first time interval, relative to the board at a substantially constant velocity while maintaining the dispensing pressure substantially at said predetermined value for a predetermined second time interval; and removing the pressure within the dispenser at the end of the second time interval.

BRIEF DESCRIPTION OF THE DRAWINGS

FIG. 2 is a perspective schematic representation of the interior of a multipoint dispensing nozzle in accordance with an embodiment of the invention;

FIGS. 3A and 3B show time diagrams of the dispensing parameters in accordance with one embodiment of the invention;

DETAILED DESCRIPTION

Although the following description relates to multipoint dispensing of solder paste, it is well within the spirit and scope of the present invention to apply the inventive concepts disclosed herein to dispensing other types of viscous materials. Viscous materials of a type having a dispense viscosity ranging from about $2 \times 10^5$ cps to about $2 \times 10^6$ cps at 1 sec$^{-1}$ shear rate may be dispensed using the teachings described herein. In other words, the various principles to be described hereafter are readily applicable to materials such as adhesives (e.g., conductive as well as nonconductive epoxies), silicones (e.g., Room Temperature Vulcanizing (RTV) Silicone), rubbers, and/or other viscous materials widely used in the electronic industry.

Figure 1:
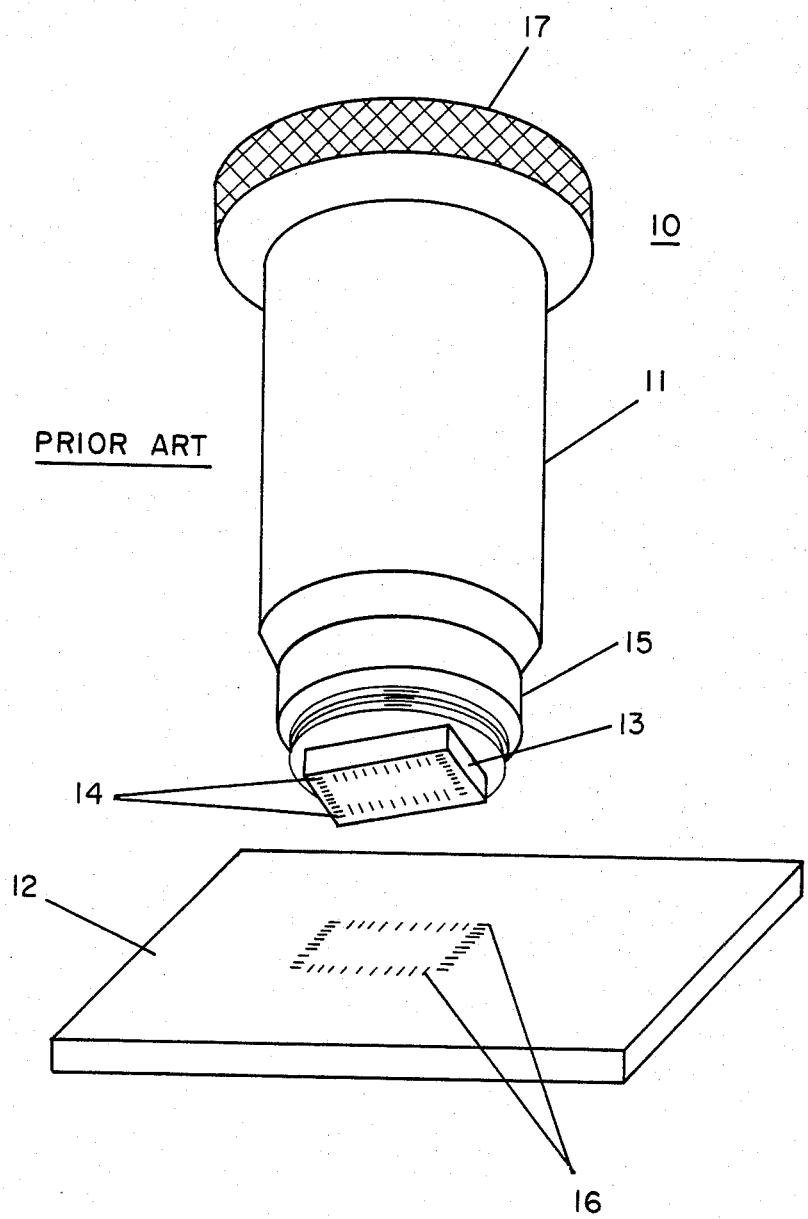
FIG. 1 shows a known multipoint solder paste dispenser.

In FIG. 1, reference numeral 10 indicates a multipoint solder paste dispenser of the type described in the above-referenced paper by D. Schoenthaler (see FIG. 5 thereof). The dispenser 10 comprises a generally cylindrical hollow cartridge 11 adapted to receive solder paste to be dispensed on a printed wiring board (PWB) 12. A nozzle 13 having a plurality of openings 14 is attached at one end 15 of the cartridge 11. As shown in FIG. 1, the openings 14 are located along the periphery of the nozzle 13 and are spaced and shaped to substantially match a plurality of bond sites 16 on the PWB 12. At the other end 17 of the cartridge 11, pressurized air is supplied thereto to force solder paste out of the openings 14 of the nozzle 13 onto the bond sites 16 of the PWB 12.

MULTIPOINT DISPENSING PROCESS

Shown in FIG. 2 is an inside perspective view of a nozzle 20 according to an illustrative embodiment of the invention. The nozzle 20 has a flat bottom face 21 with a plurality of openings 22 arranged in a predetermined pattern. The openings 22 are dimensioned and spaced to substantially correspond to the metallized terminations of a chip carrier (not shown) to be mounted on a board 23. Also shown on the board 23 is a plurality of bond sites 24 having a pattern substantially identical to that of the nozzle openings 22. Alignment of the openings 22 with the bond sites 24 may be achieved by using any well known alignment technique, such as that described in U.S. Pat. No. 4,295,596 assigned to the instant assignee.

The nozzle 20 is adapted to be connected at one end of a cylindrical solder paste cartridge 25 comparable to the cartridge 11 of FIG. 1. The solder paste may be selected from known commercially available types commonly used in the electronics industry. Positioned within the nozzle 20 is a pyramid shaped diverter 26 for directing the paste flow towards the openings 22. The diverter 26 prevents stagnation of the paste in the central portion of the nozzle 20 while, at the same time, reducing the volume of paste needed to fill the nozzle 20 and the cartridge 25.

A solder paste dispensing sequence will be described with reference to FIGS. 2, 3A and 3B. At a first stage of the sequence, the nozzle 20 and the board 23 are moved relative to each other, and are positioned at a predetermined initial distance, δ, from each other. Although the initial distance, δ, is shown in FIG. 2 as being different from zero, the present teachings are also applicable when the surface 21 of the nozzle 20 and the board 23 are initially in contact with each other. During a time interval $t_1$, pressurized air is supplied to the dispensing tool (i.e., to the cartridge 25 and the nozzle 20 attached thereto) forcing paste out of the orifices 22 onto, and in adherence with, the bond sites 24 of the board 23 thus closing the initial gap, if any, between the bottom face 21 of the nozzle 20 and the board 23. At time $t_1$, the dispensing tool (including the nozzle 20 and the cartridge 25) is moved upwards and away from the surface of the board 23 at a predetermined substantially constant velocity, V. Alternatively, if the dispensing tool is fixed, then at time $t_1$ the board 23 is moved downwards and away from the tool at the constant velocity, V. While the dispensing tool is moving away from the board 23, the dispense air pressure, P, remains substantially constant and is terminated at time $t_2$. The dispensing nozzle 20 continues to move upwards causing the paste adhering to the board 23 to separate from the nozzle openings 22 thus leaving deposits on the bond sites 24 of board 23.

The foregoing dispensing sequence achieved reliable and reproducible multipoint dispensing of solder paste when predetermined process parameters were accurately monitored. In accordance with an embodiment of the invention, these process parameters include the initial gap, δ; the dispense pressure P, the tool velocity V and the time periods $t_1$ and $t_2$. In a preferred embodiment of the invention, the initial gap δ is of the order of 0.0 to 0.010 inch, the higher end of such range allowing for board warpage; the dispense pressure P ranges between 1 and 10 psi; the range of the tool velocity V is between 0.5 and 5 inch/minute; the delay time $t_1$ is of the order of 0.1 to 0.5 sec.; and the dispense time $t_2$ is typically between 0.2 and 1.0 sec. When selecting a short delay time $t_1$ of about 0.1 sec, the preferred corresponding dispense time $t_2$ is selected in a range between 0.2 and 0.4 sec. If the delay time $t_1$ is a longer one, e.g., of the order of 0.5 sec., the preferred dispense time $t_2$ is set between 0.65 and 1.00 sec. One condition to be maintained for the selection of the two time periods $t_1$ and $t_2$ is that the latter is always larger than the former in order to permit the paste to be fed out of the nozzle as the latter retracts.

SOLDER PASTE LOADING

An important aspect of solder paste dispensing is the method used to load solder paste into the dispensing cartridge and nozzle assembly. Poor dispensing usually results from anomalies such as semirigid paste, crust, and/or voids. Large volumes of crust or semirigid paste will clog the small openings of the dispensing nozzle. Moreover, voids near the nozzle orifices tend to cause preferential paste flow around such voids resulting in skips (i.e., no deposit) similar to physically clogged openings.

Figure 4:
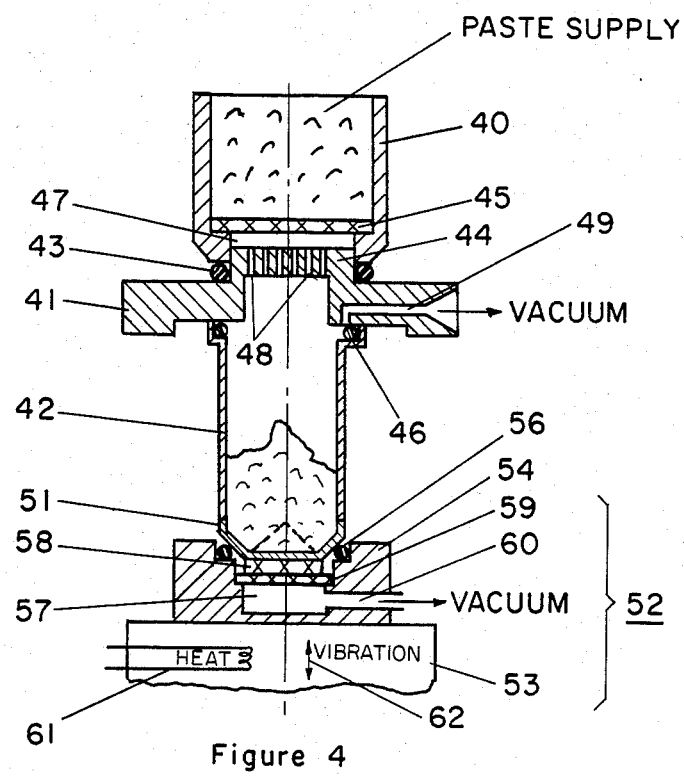
FIG. 4 illustrates a solder paste loading technique in accordance with another embodiment of the invention.

FIG. 4 schematically illustrates a method and an apparatus for loading paste into the dispenser cartridge and nozzle in accordance with an embodiment of the invention. Solder paste is placed in a supply container 40 where it is warmed by being mixed vigorously without introducing additional air or changing the character of the paste itself. Heat is applied if necessary to elevate the paste temperature to about 100°-120° F. The supply container 40 is coupled to one side of an adaptor plate 41 which in turn is located on top of a dispensing cartridge 42 to be loaded or filled with solder paste.

A first seal 43 is located around a neck portion 44 of the adaptor plate 41 to prevent leaks between the supply container 40 and the adaptor plate 41. A second seal 46 is positioned between the top portion of the dispensing cartridge 42 and the adaptor plate 41. A wire screen 45 is positioned proximate to the bottom of the supply container 40 for filtering semirigid paste and crust particles out of the paste prior to its transfer into the dispensing cartridge 42. A small gap 47, formed between the top of the neck portion 44 of the adaptor plate 41 and the wire screen 45, reduces the amount of paste wasted each time a filled supply container is attached to the plate 41.

The neck portion 44 of the adaptor plate 41 comprises at least one hole 48 for allowing paste to be transferred from the supply container 40 into the dispensing cartridge 42. Preferably, an array of small diameter holes (such as holes 48) is formed in the neck portion 44 of the adaptor plate 41. The latter further comprises an elongated chamber 49 for coupling a vacuum source (not shown) to the top portion of the dispensing cartridge 42.

The bottom portion of the dispensing cartridge 42 comprises a multi-orifice nozzle 51 attached thereto. The nozzle 51 is of a type described above in connection with FIG. 2. The dispensing tool including the cartridge 42 and the nozzle 51 is placed on a loading station 52 which comprises a loading table 53 and a supporting body 54. Body 54 comprises, in a recessed portion thereof, a seal 56 adapted to mate with the periphery of the nozzle 51. Also comprised within a central opening 57 of the body 54 is a filtering arrangement comprising a filter member 58 supported by a porous member 59, such as a metal screen or a rigid plate having a plurality of holes therethrough. The filter member 58 may be, for example, a sheet of filter paper. Preferably, the filter member 58 includes a rough-surfaced rubber pad positioned within the opening 57 of the supporting body 54 such that its top rough surface is in slight contact with the bottom flat face of the nozzle 51. The supporting body 54 further comprises an elongated conduit 60 for coupling a source of vacuum (not shown) to its central opening 57.

In order to load paste into the dispensing cartridge 42, the paste is pulled by vacuum (applied via the chamber 49) through the wire screen 45 and the array of holes 48 from the supply container 40 into the cartridge 42. Also, vacuum is pulled (via conduit 60 and central opening 57) from beneath the nozzle 51 through the filtering arrangement 58,59. Furthermore, heat is applied to the entire loading apparatus, as schematically illustrated by reference numeral 61 in FIG. 4, such that the paste and all nozzle and cartridge surfaces are maintained within a predetermined range of about 100°-120° F. dependent upon the type of paste used. Heating of the paste enables it to maintain its viscosity in a suitable range resulting in good flow characteristics.

The vacuums applied via chamber 49 and conduit 60 are held constant while paste is pulled into the dispensing cartridge 42. When the paste is fully loaded into the cartridge/nozzle assembly, the vacuums are maintained while the loading table 53 is vibrated up and down in the axial direction of the cartridge 42 as illustrated by bidirectional arrow 62. Typically, the table 53 would be vibrating during an initial period of about 20 seconds with vacuums applied. Next, with the vacuums turned off, the vibration of the table 53 is continued for an additional period of about 10 seconds. The use of a rough-surfaced rubber pad as a filter member 58 is advantageous in that grooves in the rough surface permit each nozzle opening to be filled by the vacuum pulled, through conduit 60, from under the screen 59. The foregoing causes a complete filling of the nozzle 51. The combination of elevated temperature, mechanical vibration and application of vacuum above as well as beneath the paste within the cartridge/nozzle assembly, tends to extract any entrapped air and cause the paste to settle in the cartridge without forming voids which would subsequently fill with air resulting in the drying of portions of the paste and voids or skips in the deposits.

SOLDER PASTE HANDLING

The solder paste used for dispensing dries slowly such that electronic devices can be easily placed into the solder paste deposits within a one hour time frame after deposition. After about two hours, the surface of the deposited paste becomes noticeably dry, and after 24 hours the deposits are rigid. Thus, a solder paste dispenser remaining idle for about one hour will become clogged and useless as paste dries at the nozzle orifices and on the surface internal to the dispensing cartridge.

Figure 5:
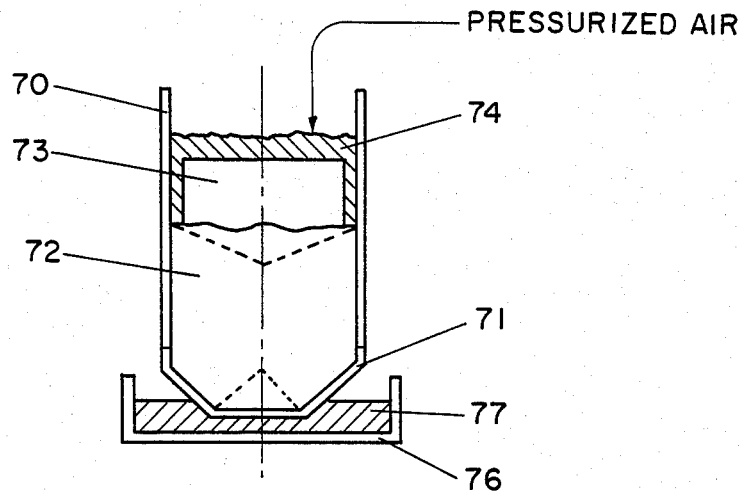
FIG. 5 schematically shows a technique for preventing paste crust formation in accordance with a further embodiment of the invention.

FIG. 5 schematically illustrates a technique for preventing the paste from drying and forming a crust layer in accordance with another illustrative embodiment of the invention. A dispensing cartridge 70, with a multi-orifice nozzle 71 attached thereto, contains a volume of solder paste 72 to be dispensed. As already mentioned above, pressurized air is applied to the top portion of the cartridge 70 to force the paste 72 out of the orifices of the nozzle 71.

In order to evenly transmit the applied air pressure to the body of the paste 72, a floating piston 73 is positioned within the cartridge 70 above the paste 72. The piston 73 is preferably tapered and sized to influence self-centering and prevent an air blow through in sections of lower paste viscosity. In accordance with a preferred embodiment of the invention, a liquid 74 is applied around the floating piston 73 and acts as a liquid seal. Moreover, after using the dispensing assembly 70,71 and if the latter would not be operated again within about 15 minutes, the nozzle 17 is preferably lowered into a small dish 76 containing a liquid seal 77 thereby preventing paste in the orifices of the nozzle 71 from drying. Liquids such as commercially available wave soldering oils and/or fluorinated hydrocarbon materials may be used for the liquid seal 74 and the liquid 77 contained in the nozzle dish 76.

DISPENSING VISCOSITY CONTROL

Figure 6:
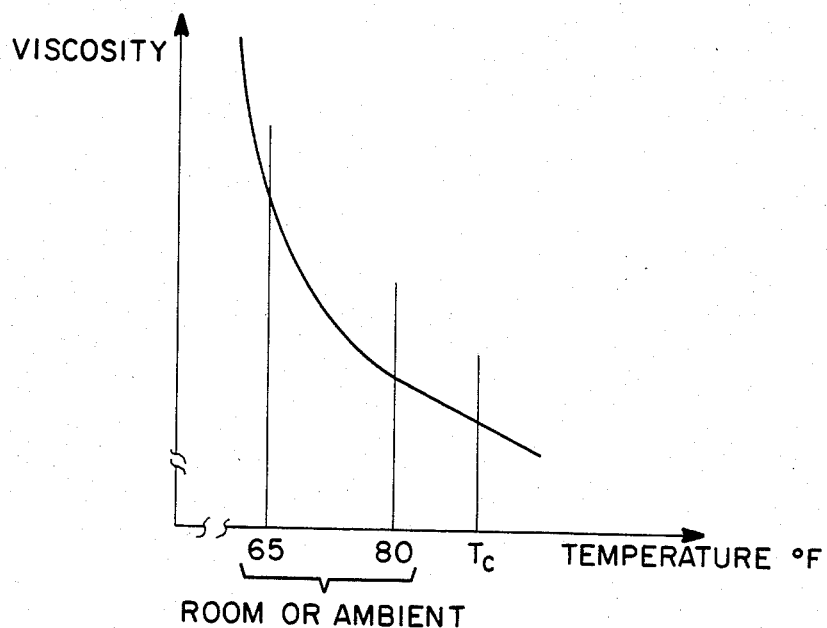
FIG. 6 illustrates the effect of temperature on solder paste viscosity.

As already mentioned above, the temperature of the paste during dispensing is one of the variables affecting the dispensing results. Indeed, most commercial solder pastes exhibit a substantial reduction in viscosity with a relatively small increase in temperature (e.g., between 15° and 20° F.) as illustrated in FIG. 6. According to another embodiment of the invention, consistent dispensing results can be achieved by adequately controlling the viscosity of the paste by monitoring and controlling the paste temperature and maintaining it at a control temperature, $T_c$, above the usual ambient temperature range.

Figure 7:
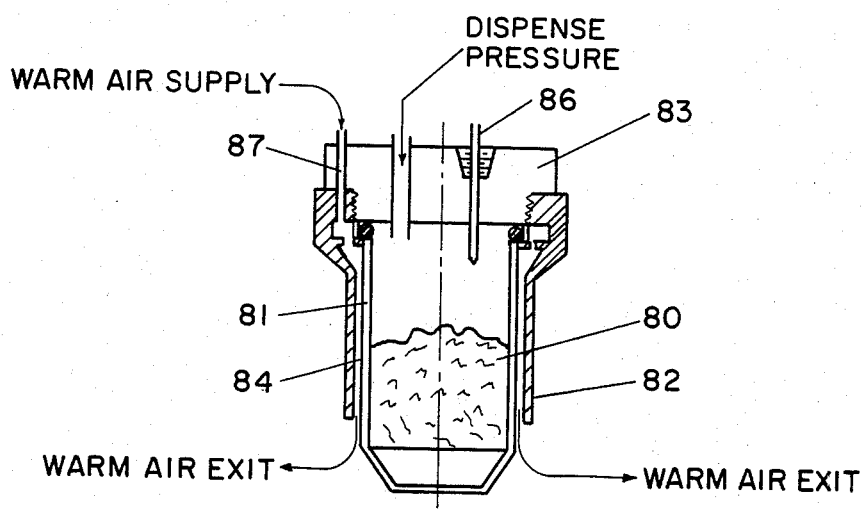
FIG. 7 illustrates a technique for controlling the viscosity of the solder paste according to a still further embodiment of the invention.

FIG. 7, schematically shows an arrangement for controlling the viscosity, and hence the temperature, of the paste 80 within a dispensing cartridge 81. A jacket sleeve 82 is attached to a dispensing assembly support plate 83 and shaped such that a gap 84, formed between the sleeve 82 and the cartridge 81, surrounds the dispensing cartridge 81. A temperature sensitive control device 86 is attached to, and through, the support plate 83 to enable the monitoring of the temperature within the dispensing cartridge 81. A conduit 87, within the plate 83, connects a source of warm fluid (not shown) to the gap 84 between the sleeve 82 and the dispensing cartridge 81. The warm fluid exits the gap 84 at the bottom of the sleeve 82 thereby keeping the paste 80 within a predetermined temperature range in response to the temperature sensitive control device 86. In a preferred embodiment, a low flow of warm air, supplied to the fluid conduit 87, keeps the paste 80 at a desired temperature.

The heating mechanism in FIG. 4, which is symbolically represented by reference numeral 61, may include a sleeve and warming fluid arrangement of the type described in FIG. 7. In particular, a warm air flow around the dispensing cartridge 42 of FIG. 4 would maintain the solder paste within prescribed temperatures during the cartridge loading operation.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. A method for multipoint dispensing of viscous material onto a substrate, comprising the steps of:
   positioning a viscous material dispenser, having a plurality of orifices, at a predetermined distance from the substrate surface;
   during a first time interval, increasing the pressure within the dispenser to a predetermined value thereby forcing viscous material out of the dispenser orifices onto the substrate surface;

at the end of the first time interval, increasing the distance between the dispenser and the substrate at a substantially constant velocity while maintaining the dispensing pressure substantially at said predetermined value for a predetermined second time interval; and removing the pressure within the dispenser at the end of the second time interval to stop the flow of the viscous material from the dispenser.

2. A method according to claim 1, wherein the first time interval is of the order of 0.1 sec. to 0.5 sec.

3. A method according to claim 1, wherein the viscous material dispense time comprising the first and second time intervals is of the order of 0.2 sec. to 1.0 sec.

4. A method according to claim 1, wherein the predetermined pressure value ranges between 1 and 10 psi.

5. A method according to claim 1, wherein the viscous material is selected from the group comprising solder pastes, adhesives, silicones, RTV, and rubbers.

6. A method according to claim 1, wherein the positioning step comprises positioning the orifice of the dispenser at about 0 to 10 mils from the surface of the board.

7. A method according to claim 6, wherein the dispenser velocity ranges between 0.5 and 5 inches per minute.

8. A method for multipoint dispensing of viscous material onto a board, comprising:

positioning a viscous material dispenser, having a plurality of orifices, at such a location that the orifices of the dispenser are at about 0 to 10 mils from the surface of the board;

during a first time interval, increasing the pressure within the dispenser to a predetermined value thereby forcing viscous material out of the dispenser orifices onto the board;

moving the dispenser, at the end of the first time interval, relative to the board at a substantially constant velocity while maintaining the dispensing pressure substantially at said predetermined value for a predetermined second time interval; and removing the pressure within the dispenser at the end of the time interval.

9. A method for multipoint dispensing of viscous material onto a board comprising:

positioning a viscous material dispenser having a plurality of orifices at a predetermined distance from the board;

during a first time interval, increasing the pressure within the dispenser to a predetermined value thereby forcing viscous material out of the dispenser orifices onto the board;

moving the dispenser, at the end of a first time interval, relative to the board at a substantially constant velocity that ranges between 0.5 and 5 inches/minute, while maintaining the dispensing pressure substantially at said predetermined value at a predetermined second time interval; and removing the pressure within the dispenser at the end of the second time interval.

10. A method for dispensing a plurality of solder paste deposits onto a plurality of bonding areas of a printed wiring board (PWB) comprising the steps of:

positioning a solder paste dispensing nozzle having a plurality of orifices at a predetermined distance from the PWB;

during a first time interval, increasing the pressure within the dispensing nozzle to a predetermined pressure value thereby dispensing solder paste out of the plurality of orifices onto the PWB;

moving the nozzle, at the end of the first time interval, relative to the PWB at a substantially constant velocity while maintaining the pressure substantially at the predetermined pressure value for a predetermined second time interval; and removing the pressure within the nozzle at the end of the second time interval.

11. A method according to claim 10, wherein the positioning step comprises positioning the bottom surface of the nozzle including the plurality of orifices at about 0 to 10 mils from the surface of the PWB.

12. A method according to claim 10, wherein the first time interval, $t_1$, is of the order of 0.1 sec. to 0.5 sec.

13. A method according to claim 10, wherein the solder paste dispense time, $t_2$, comprising the first and second time intervals is of the order of 0.2 sec. to 1.0 sec.

14. A method according to claim 13, wherein the first time interval, $t_1$ is about 0.1 sec. and the solder paste dispense time, $t_2$, ranges between 0.2 sec. and 0.4 sec.

15. A method according to claim 13, wherein the first time interval, $t_1$, is about 0.5 sec. and the solder paste dispense time, $t_2$, ranges between 0.65 sec. and 1.00 sec.

16. A method according to claim 10, wherein the predetermined pressure value ranges between 1 and 10 psi.

17. A method according to claim 10, wherein the velocity of the nozzle ranges between 0.5 and 5 inches/minute.

* * * * *